United States Patent [19]

Kimura et al.

[11] Patent Number: 5,055,820
[45] Date of Patent: Oct. 8, 1991

[54] HALL ELEMENT AND MAGNETIC SENSOR SYSTEM EMPLOYING THE SAME

[75] Inventors: Masatoshi Kimura; Toshio Kumamoto, both of Hyogo, Japan

[73] Assignee: Mitsubishi Denki Kabushiki Kaisha, Tokyo, Japan

[21] Appl. No.: 461,145

[22] Filed: Jan. 4, 1990

[30] Foreign Application Priority Data

Jan. 20, 1989 [JP] Japan .................................. 1-12916

[51] Int. Cl.$^5$ ............................................. H01L 43/00
[52] U.S. Cl. ................................................. 338/32 H
[58] Field of Search ........................... 338/32 H, 32 R; 324/117 H; 323/368

[56] References Cited

U.S. PATENT DOCUMENTS 4,584,552 4/1986 Suzuki et al. ...................... 338/32 H
4,829,352 5/1989 Popovic et al. .................. 338/32 H

FOREIGN PATENT DOCUMENTS 59-87884  5/1984 Japan .
62-208682 9/1987 Japan .
63-61167  4/1988 Japan .

OTHER PUBLICATIONS

Kogyo Chosakai Publishing Co., Ltd., "The Technique for Utilizing a Sensor", edited by Kogyochosakai-Henshubu, Japan, 1984, pp. 260–261.

Primary Examiner—Marvin M. Lateef
Attorney, Agent, or Firm—Lowe, Price, Leblanc and Becker

[57] ABSTRACT

A Hall device a semiconductor region embedded in a substrate, the embedded region having opposite main and back surfaces and a pair of side surfaces parallel to and spaced apart from respective ones of the main, back and side surfaces of the substrate. A pair of current electrodes are formed of first highly doped regions embedded in the substrate respectively (i) between the main surfaces of the substrate and the semiconductor region and (ii) between the back surfaces of the substrate and semiconductor region so as to sandwich the semiconductor region between the main and back surfaces of the substrate. A pair of Hall voltage detecting electrodes are formed of second highly doped regions embedded in the substrate, respectively between side surfaces of the substrate and semiconductor region. The substrate can be made of $SiO_2$ to increase electrical isolation between the electrodes.

7 Claims, 13 Drawing Sheets

HALL ELEMENT AND MAGNETIC SENSOR SYSTEM EMPLOYING THE SAME

BACKGROUND OF THE INVENTION

1. Field of the Invention

The present invention relates to a Hall element and a magnetic sensor system and, more particularly, to a new Hall element adapted for miniaturization and a magnetic sensor system employing the same.

2. Description of the Background Art

Prior to the description of a conventional magnetic sensor system, a description is given of a Hall effect. FIG. 13 is a conceptual diagram for describing the Hall effect. Referring to FIG. 13, when a vertical magnetic field $H_Z$ is applied to a long and narrow plate through which a uniform current $I_X$ flows in a direction of the X-axis, an electromotive force Ey is generated in a direction Y vertical to $H_Z$, $I_X$ and a current flows in a conductor ACB connected at the external portion. This phenomenon is called the Hall effect, which is used in a simple magnetic field detector, a direction detector and the like.

FIG. 14 is a conceptual diagram of a magnetic sensor system using the conventional Hall device. The Hall devices 10 are arranged on the X-Y plane, Y-Z plane, and the Z-X plane. The output terminals of the respective Hall devices are electrically connected to an A/D converter 12 through a switch 11 and the A/D converter 12 is electrically connected to a digital signal processing circuit 13. Next, a description is given of a structure of the conventional Hall device 10.

FIG. 15 is a perspective view of the conventional Hall device, FIG. 16 is a perspective view taken along a direction of an arrow XVI in FIG. 15, FIG. 17 is a view taken along a direction of an arrow XVII in FIG. 15, and FIG. 18 is a view taken from a direction of an arrow XVIII in FIG. 15. Referring to these figures, the Hall device 10 comprises a P type semiconductor substrate 14. The P type semiconductor substrate 14 has a main surface 14a, a back surface 14b and a side surface 14c. An N type semiconductor region 7 is provided in the P type semiconductor substrate 14. A pair of electrodes 9 are provided so as to sandwich the N type semiconductor region 7 between both sides. In addition, a pair of Hall voltage detecting electrodes 8 and 8 are provided so as to sandwich the N type semiconductor region 7 in a direction vertical to the arrangement direction of the above-described pair of electrodes 9 and 9. Now, referring to these figures, a description is given of an operation of the Hall device. When a current flows between the pair of electrodes 9 and 9 and a magnetic flux component B is introduced from a direction of an arrow XVI (that is, a direction vertical to the substrate) into the N type semiconductor region 7, the Hall electromotive force is generated between the Hall voltage direction electrodes 8 and 8 by the Hall effect.

Referring to FIG. 14 again, the conventional magnetic sensor system is constituted by arranging the above-described Hall devices on the X-Y plane, on the Y-Z plane and on the Z-X plane. The Hall device 10 on the X-Y plane detects a component $B_Z$ of the Z-axis direction of the magnetic flux, the Hall device 10 on the Y-Z plane detects a component $B_X$ of the X-axis direction of the magnetic flux and the Hall device 10 on the Z-X plane detects a component $B_Y$ of the Y-axis direction of the magnetic flux. The respective magnetic flux components of the directions are separately inputted to the A/D converter 12 by the switch 11 and then, its size, direction and the like are calculated by the digital signal processing circuit 13.

Next, a description is given of a method of manufacturing the conventional Hall device.

FIG. 19A to 19F are perspective views of the conventional Hall device at different steps of a method of manufacturing the same. Referring to FIG. 19A, a resist 15 is applied to a P type semiconductor substrate 14. Referring to FIG. 19B, the resist 15 at the portion in which current electrodes and Hall voltage detecting electrodes are formed is opened. Referring to FIG. 19C, n+ impurity ions 16 are then implanted using the resist 15 as a mask and, thereafter, the N+ impurity ions are diffused in the P type semiconductor substrate 14. Next, the resist 15 is removed. As a result, the current electrode and the Hall detecting electrodes are formed. Referring to FIG. 19D, a resist 17 is applied to the whole surface of the P type semiconductor substrate 14 and the portion of the resist 17 sandwiched by the current electrode and the Hall voltage detecting electrode is opened. Referring to FIG. 19E, N type impurity ions 18 are then implanted using the resist 17 as a mask and, thereafter, the $n^{30}$ impurity ions are diffused in the P type semiconductor substrate 14. As a result, referring to FIG. 19F, a pair of current electrodes 9 and 9, a pair of Hall voltage rejecting electrodes 8 and 8 and an N type semiconductor region 7 sandwiched by the pair of current electrodes 9 and 9 and the pair of Hall voltage detecting electrodes 8 and 8 are formed.

Since the conventional Hall device and magnetic sensor system are structured as described above, it is necessary to arrange the Hall device in three directions as shown in FIG. 14. Therefore, there was a disadvantage that the size of the device became large, and the larger the size of the device was, the bigger power consumption was caused.

SUMMARY OF THE INVENTION

An object of the present invention is to provide a Hall device adapted for miniaturization in the size of a device.

Another object of the present invention is to provide a magnetic sensor system capable of reducing the power consumption.

The Hall device in accordance with the present invention comprises a substrate having a main surface, a back surface and side surfaces connected to the main surface and the back surface and a semiconductor region provided in the substrate. The Hall device further comprises a pair of current electrodes provided in the substrate so as to sandwich the semiconductor region between the main surface and the back surface; and a pair of voltage detecting electrodes provided in the substrate so as to sandwich the semiconductor region between the side surfaces.

The magnetic sensor in accordance with the present invention comprises a first substrate and a second substrate provided on the first substrate. The first substrate comprises a first Hall device which detects a magnetic flux component of a direction vertical to the first substrate. The second substrate comprises a second Hall device which detects a magnetic flux component of a direction vertical to the magnetic field direction of the magnetic flux component detected by the first Hall device.

According to a preferred embodiment of the magnetic sensor system, it further comprises a third substrate provided on the second substrate. The third substrate comprises a third Hall device which detects a magnetic flux component of a direction vertical to the magnetic field direction of the magnetic flux components detected by the first and second Hall devices.

In addition, the magnetic sensor system further comprises a fourth substrate provided on the third substrate. An A/D converter and a digital signal processing circuit electrically connected to the A/D converter are formed on the fourth substrate. Output terminals of the first, second and third Hall devices are electrically connected to the A/D converter.

According to the Hall device in accordance with the present invention, since a pair of current electrodes is provided so as to sandwich a semiconductor region provided in the substrate between the main surface and the back surface of the substrate and a pair of Hall voltage detecting electrodes is provided so as to sandwich the semiconductor region between the side surfaces, when the substrate is placed on the horizontal surface, it is possible to detect a magnetic flux component of the parallel direction to the substrate. Therefore, it becomes possible to constitute a magnetic sensor system by putting this Hall device on the conventional Hall device shown in FIG. 15 and, as a result, the size of the magnetic sensor system can be miniaturized.

According to the magnetic sensor system of the present invention, the magnetic sensor system comprises a first substrate and a second substrate provided on the first substrate. The first substrate comprises a first Hall device which detects a magnetic flux component of the direction vertical to the first substrate and the second substrate comprises a second Hall device which detects a magnetic flux component of the direction vertical to the magnetic field direction of the magnetic flux component detected by the first Hall device. As a result, it becomes possible to detect magnetic flux components of two directions. Since the second substrate is put on the first substrate, the distance between the Hall devices is reduced. As a result, power consumption becomes small as compared with that of the conventional magnetic sensor system.

In addition, when a third substrate is put on the second substrate and this third substrate comprises a third Hall device which detects a magnetic flux component of the direction vertical to the magnetic field direction of the magnetic flux components detected by the first and second Hall devices, it becomes possible to detect magnetic flux components of three directions. In this case, the distance between the Hall devices is also reduced as compared with that of the conventional magnetic sensor system, whereby the power consumption is decreased.

In addition, when a fourth substrate is put on the third substrate and an A/D converter and a digital signal processing circuit electrically connected to the A/D converter are formed on this fourth substrate to electrically connect the first, second and third Hall devices to the A/D converter, the size, direction and the like of the magnetic flux components can be calculated. In this case, the distance between the devices is also reduced as compared with that of the conventional magnetic sensor system, whereby the power consumption is also decreased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, description is given of an embodiment of the present invention with reference to the figures.

Figure 1:
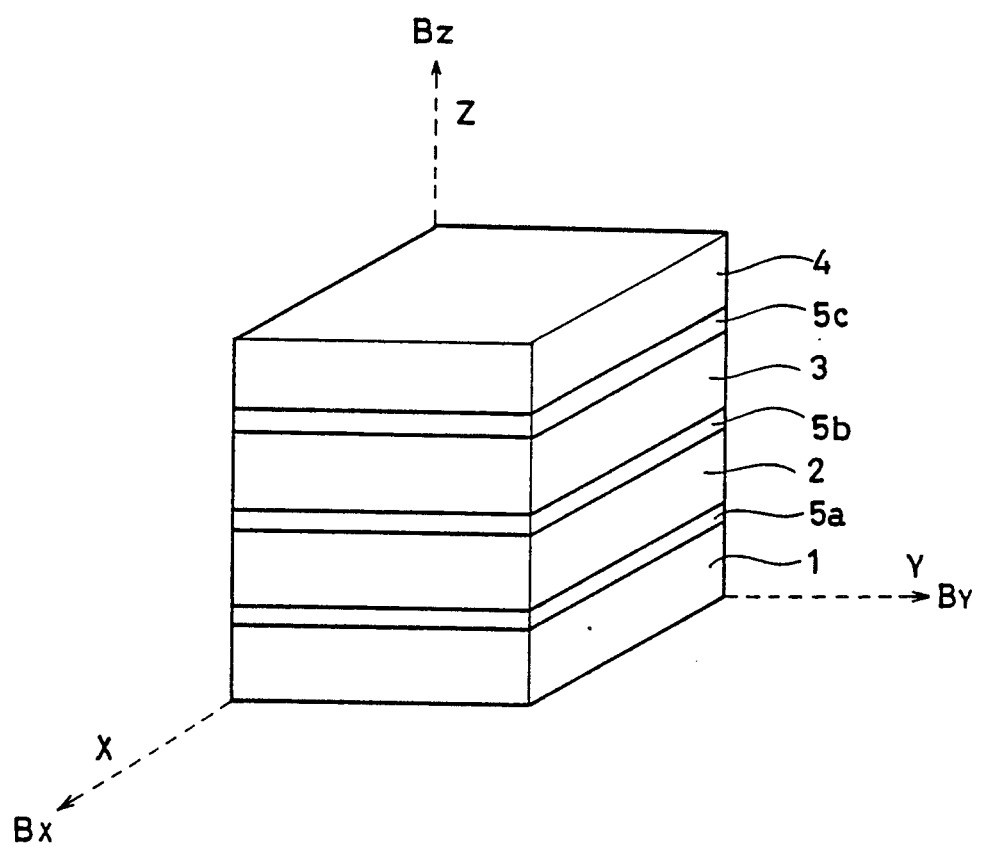
FIG. 1 is a conceptual diagram of a magnetic sensor system in accordance with the present invention.

FIG. 1 is a conceptual diagram of a magnetic sensor system in accordance with the present invention.

Figure 15:
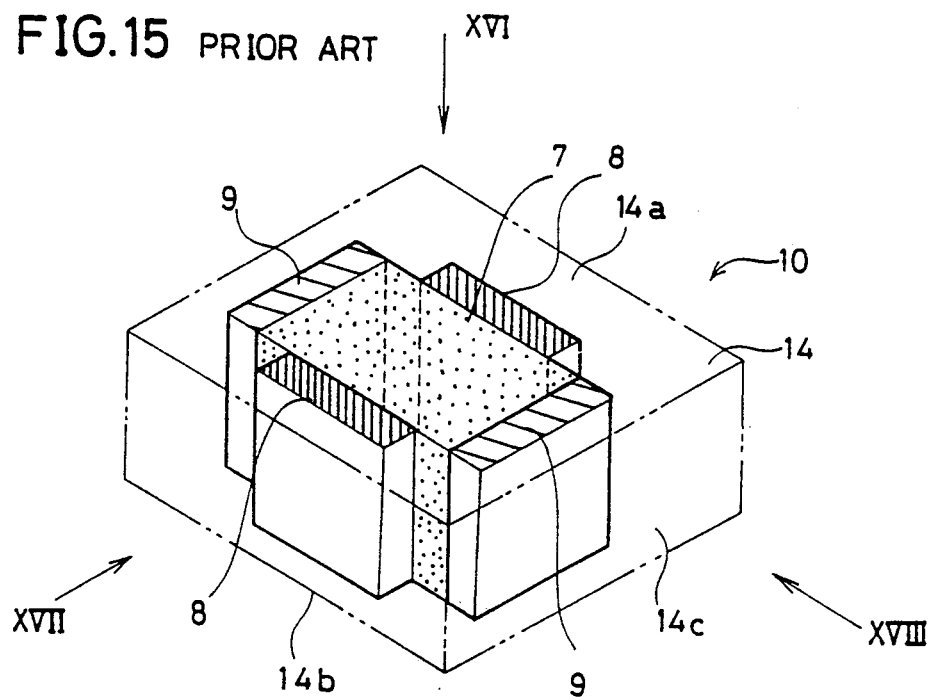
FIG. 15 is a perspective view of the conventional Hall device used in the conventional magnetic sensor system.

Referring to FIG. 1, a second substrate 2 is provided on a first substrate 1 through an insulating film 5a, a third substrate 3 is provided on the second substrate 2 through an insulating film 5b and a fourth substrate 4 is provided on the third substrate 3 through an insulating film 5c. The first substrate 1 comprises a first Hall device, for example the Hall device shown in FIG. 15 which detects a magnetic flux component $B_Z$ of the direction vertical to the first substrate 1. The second substrate 2 comprises a second Hall device which detects a magnetic flux component in the direction vertical to the magnetic field direction of the magnetic flux component detected by the first Hall device. The third substrate 3 comprises a third Hall device which detects a magnetic flux component in the direction vertical to the magnetic field directions of the magnetic flux component detected by the first and second Hall devices. An A/D converter and a digital signal processing circuit electrically connected to the A/D converter are formed on the fourth substrate. The first, second and third Hall devices are electrically connected to the A/D converter by a through hole (not shown). Prior to the description of operation of the magnetic sensor system shown in FIG. 1, a description is given of a structure of the second and third Hall devices formed on the second and third substrates 2 and 3.

Figure 2:
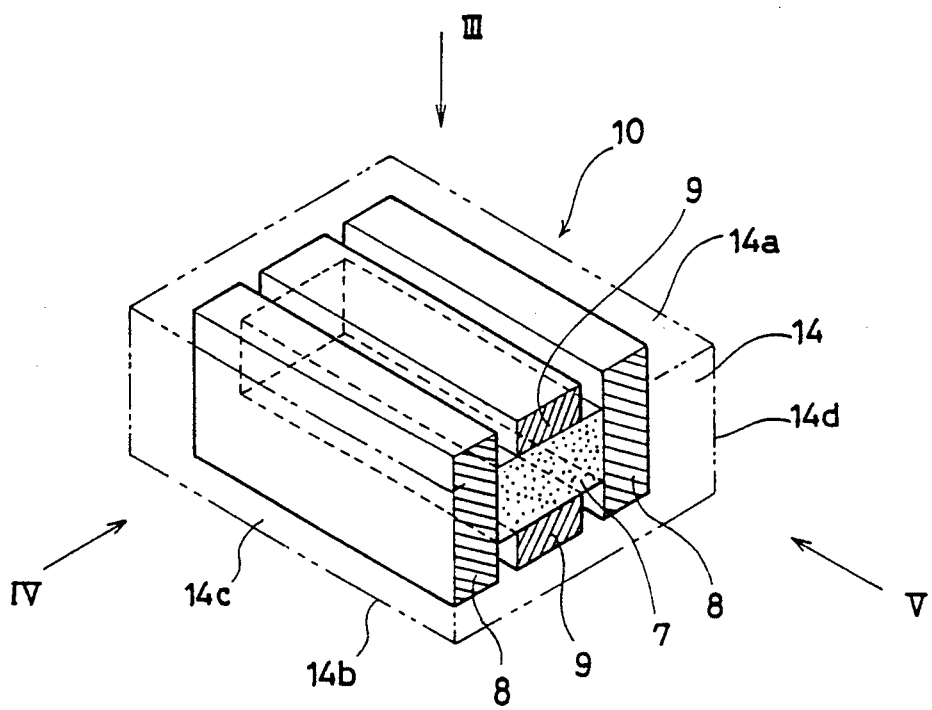
FIG. 2 is a perspective view of the Hall device in accordance with the present invention.
Figure 3:
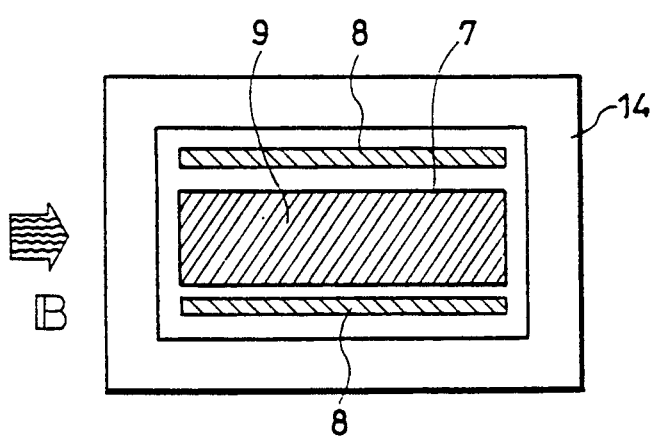
FIG. 3 is a view taken along the direction of an arrow III in FIG. 2.
Figure 5:
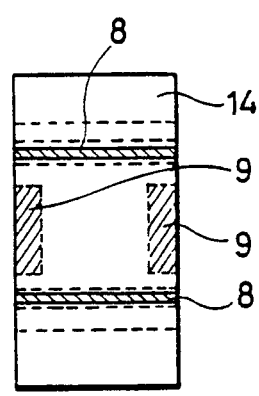
FIG. 5 is a view taken from the direction of an arrow V in FIG. 2.
Figure 4:
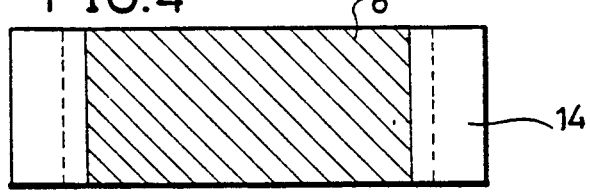
FIG. 4 is a view taken from the direction of an arrow IV in FIG. 2.

FIG. 2 is a perspective view of the Hall device in accordance with the present invention. FIG. 3 is a view taken from the direction of an arrow III in FIG. 2 and FIG. 4 is a view taken from the direction of an arrow IV in FIG. 2 and FIG. 5 is view taken from the direction of an arrow B in FIG. 2. Referring to these figures, the Hall device 10 comprises a P type semiconductor substrate 14. The P type semiconductor substrate 14 has a main surface 14a, a back surface 14b and side surfaces 14c. An N type semiconductor region 7 is provided in the P type semiconductor substrate 14. A pair of current electrodes 9 and 9 are provided so as to sandwich the N type semiconductor region 7 between the surface 14a and the back surface 14b. In addition, a pair of Hall voltage detecting electrodes 8 and 8 are provided so as to sandwiched the N type semiconductor substrate 7 between the side surface 14c and 14d.

Referring to these figures, a description is given of operation of the Hall device. When a current flows between the pair of current electrodes 9 and 9 and a magnetic flux component is introduced from the direction of an analog B to the N type semiconductor region 7, a Hall electromotive force is generated between the Hall voltage detecting electrodes 8 and 8 by the Hall effect.

Referring to FIG. 1A, the Hall device shown in FIG. 2 is arranged so as to be able to detect the magnetic flux component $B_Y$ in the direction of the Y-axis, that is, so as to make the direction of an arrow B and the direction of the Y-axis be the same as those of a second substrate 2 (which is referred to as a second Hall device hereinafter). The Hall device shown in FIG. 2 is arranged so as to be able to detect a magnetic flux component $B_X$ in the direction of the X-axis, that is, so as to make the direction of the arrow B and the direction of the X-axis the same as those of a third substrate 3 (which is referred to as a third Hall device hereinafter).

Next, a description is given of operation of the magnetic sensor system shown in FIG. 1.

The first Hall device comprised in the first substrate 1 detects a magnetic flux component in the direction of the Z-axis. The second Hall device comprised in the second substrate 2 detects a magnetic flux component in the direction of the Y-axis. The third device comprised in the third substrate 3 detects a magnetic flux component in the direction of the X-axis. As a result, the magnetic flux components of three directions can be detected and its signal is transferred to the A/D converter and the digital signal processing circuit formed on the fourth substrate 4, so that the size, direction and the like of the magnetic flux components can be calculated.

According to the embodiment, since the first, second, third and fourth of the substrates 1, 2, 3 and 4 are integrated on one chip, the device can be miniaturized. In addition, since the distance between devices is reduced as compared with that of the conventional magnetic sensor system, the power consumption is reduced accordingly.

In addition, the magnetic sensor system shown in FIG. 1 may be made by attaching the first, second, third and fourth substrates 1, 2, 3 and 4 through the insulating films 5a, 5b and 5c and, for example may be also made by repeating the deposition of a silicon.

Now, a description is given of a method of manufacturing the Hall device shown in FIG. 2. FIGS. 6A to 6F are perspective views of the Hall device shown in FIG. 2 at different steps of the manufacturing process.

Figure 6A:
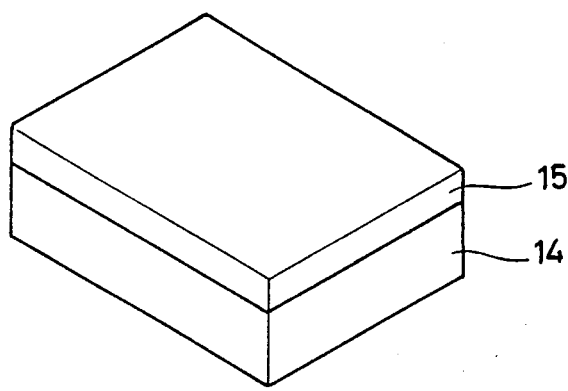
FIGS. 6A to 6F are perspective views of the Hall device shown in FIG. 2 at different steps of a method of manufacturing the same.
Figure 6B:
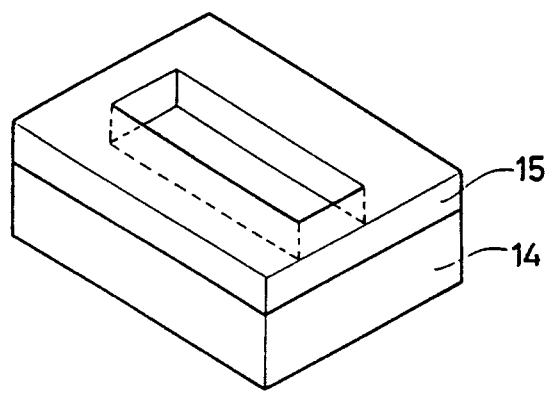
Figure 6C:
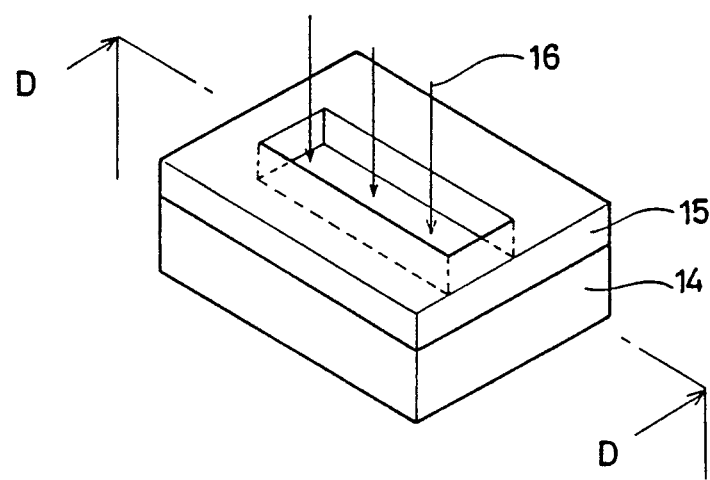
Figure 6D:
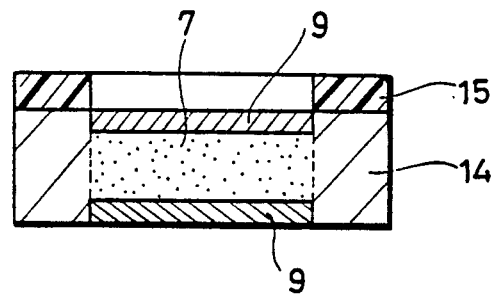
Figure 6E:
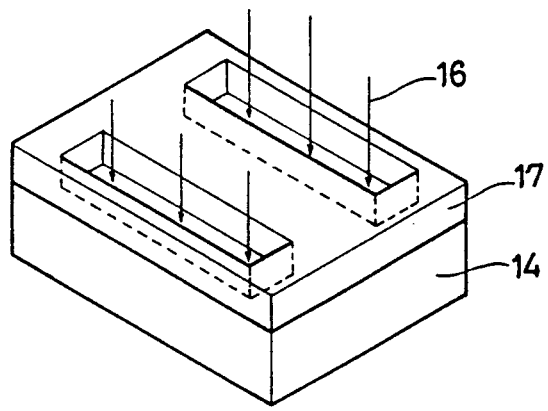
Figure 7:
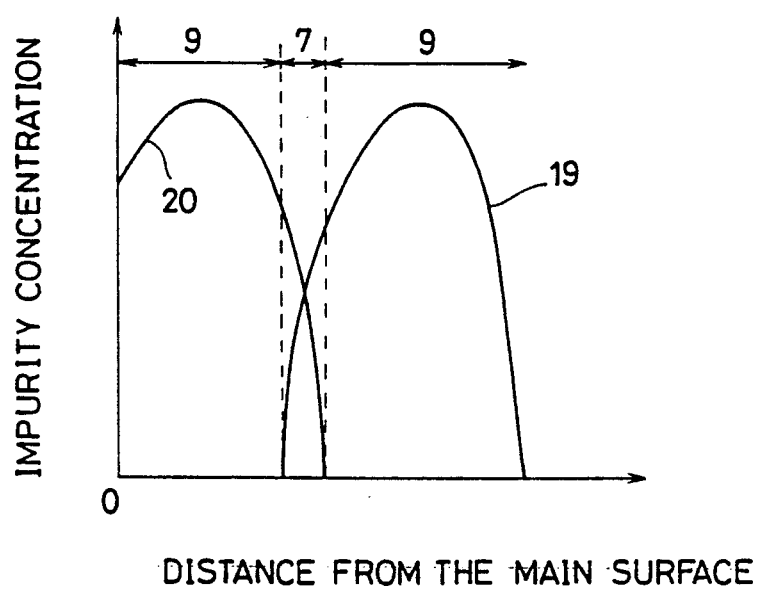
FIG. 7 is a view for describing the principle of the manufacture of the Hall device shown in FIG. 2.

Referring to FIG. 6A, a resist 15 is applied to a P type semiconductor substrate 14. Referring to FIG. 6B, the portion of the resist 15 in which current electrodes are to be formed is then opened. Referring to FIG. 6C, n+ impurity ions 16 are then implanted with high energy using the resist 15 as a mask and then $n^{30}$ impurity ions 16 are implanted with low energy one more time. As a result, referring to FIG. 6D (a sectional view taken along a line D-D in FIG. 6C), an N type semiconductor region 7 and a pair of current electrodes 9 and 9 formed so as to sandwich the N type semiconductor region 7 from the side of the main surface and the back surface are formed. The reason is described with reference to FIG. 7. Referring to FIG. 7, the abscissa shows a distance from the main surface and the ordinate shows an impurity concentration. A curve 19 represents the concentration distribution curve of the N type impurity when the $n^{30}$ impurity ions 16 are implanted with high energy. A curve 20 represents a concentration distribution curve cf the N type impurity when the n+ impurity ions 16 are implanted with low energy. Since the N type impurities are distributed as shown in FIG. 7, when the $n^{30}$ impurity ions 16 are implanted with the high energy and then the n+ impurity ions 16 are implanted with low energy again using the resist 15 as a mask as shown in FIG. 6C, an N type semiconductor region 7 is formed and a pair of current electrodes 9 and 9 are formed so as to sandwich the N type semiconductor region 7 from the side of the main surface and the back surface. The resist 15 is then removed.

Figure 16:
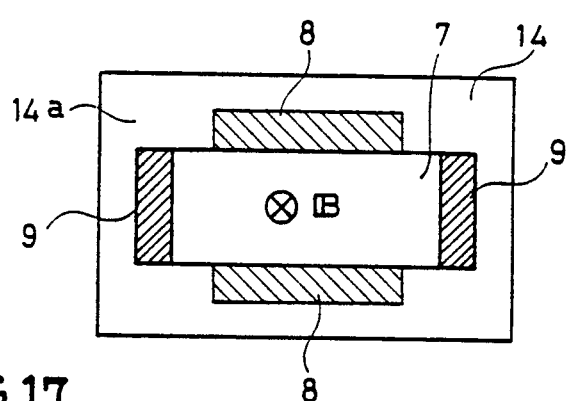
FIG. 16 is a view taken from the direction of an arrow XVI in FIG. 15.
Figure 18:
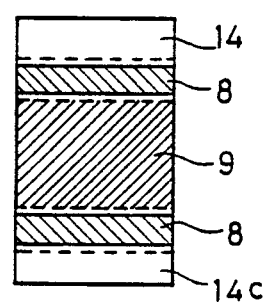
FIG. 18 is a view taken from the direction of an arrow XVII in FIG. 15.
Figure 17:
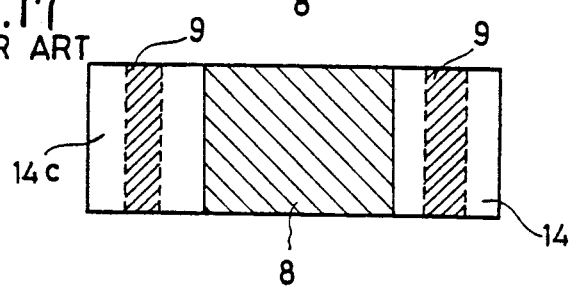
FIG. 17 is a view taken from the direction of an arrow XVII in FIG. 15.
Figure 19A:
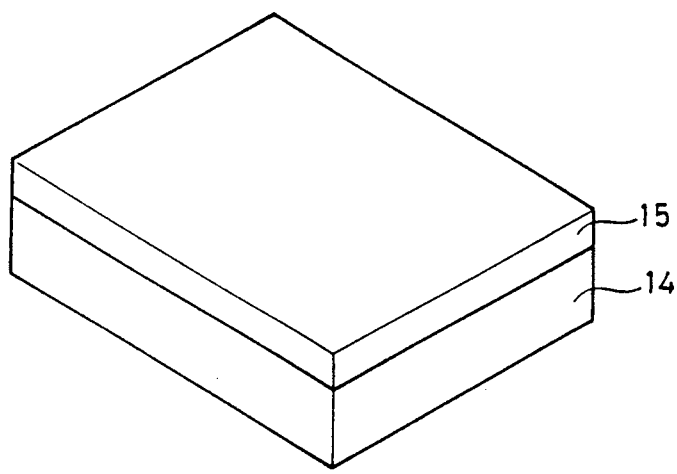
FIGS. 19A to 19F are perspective views of the Hall device shown in FIG. 15 at different steps of a method of manufacturing the same.
Figure 19B:
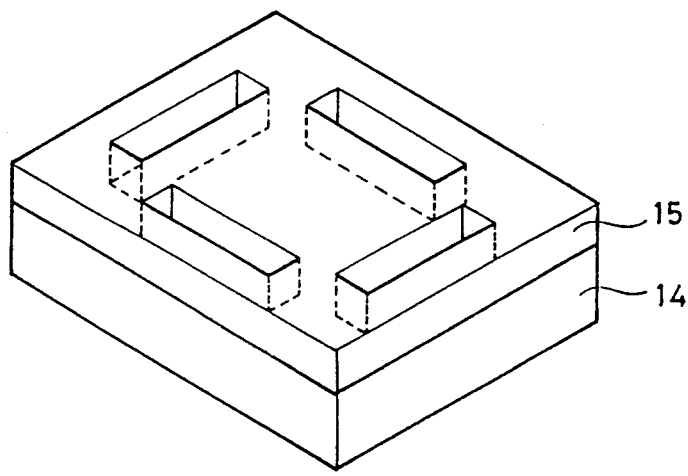
Figure 19C:
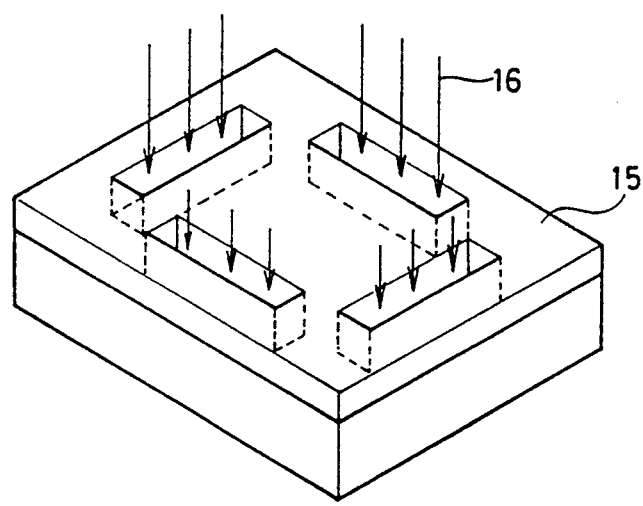
Figure 19D:
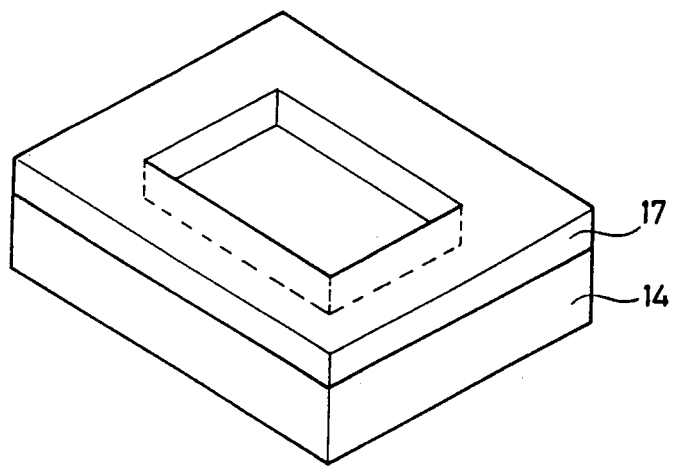
Figure 19E:
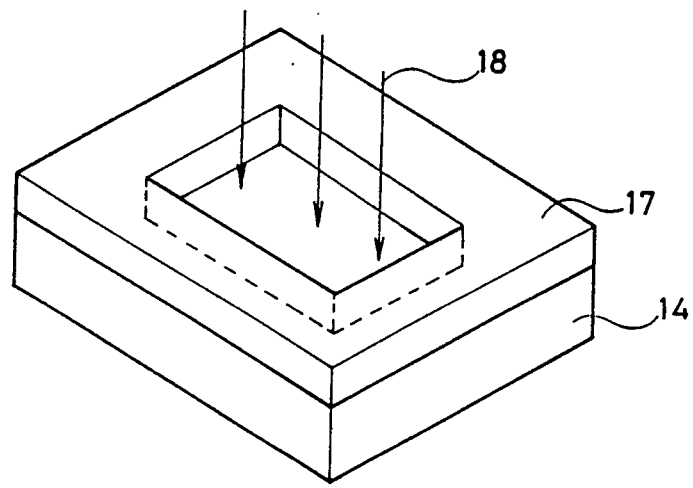
Figure 19F:
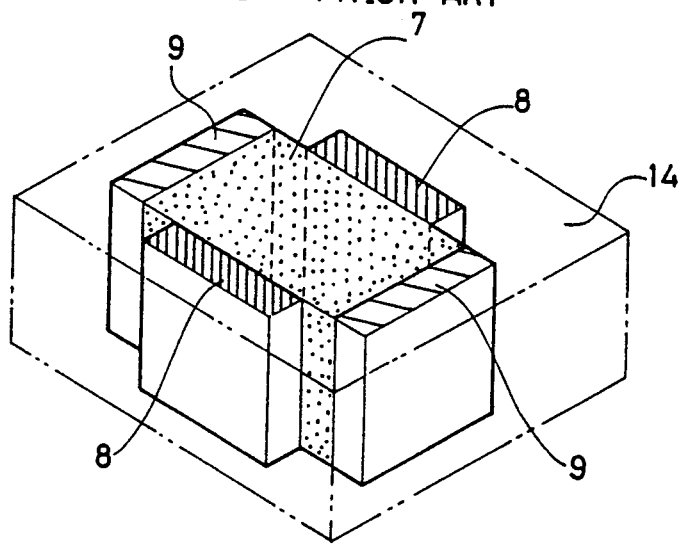

Thereafter, referring to FIG. 16E, a resist 17 is applied to the whole surface of the P type semiconductor substrate 14 and the portion of the resist 17 on which Hall voltage detecting electrodes are to be formed is opened. Then, $n^{30}$ impurity ions 16 are implanted using the resist 17 as a mask to diffuse the impurity ions 16 in the P type semiconductor substrate 14. Then, the resist 17 is removed.

Figure 6F:
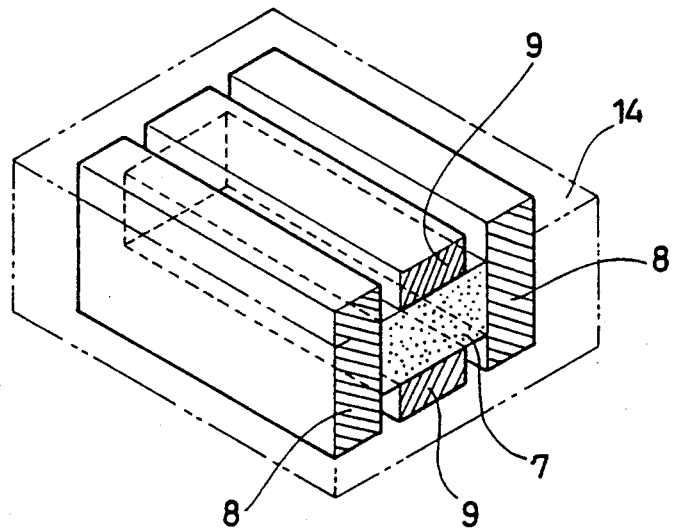

Referring to FIG. 6F, there is formed the Hall device comprising the semiconductor substrate 14 having a main surface, back surface and side surfaces connected to the main and back surfaces, the semiconductor region 7 provided in the semiconductor substrate, the pair of current electrodes 9 and 9 provided in the semiconductor substrate 14 so as to sandwich the semiconductor region from the side of the main surface and the back surface, and the pair of Hall voltage detecting electrodes 8 and 8 provided in the semiconductor substrate 14 so as to sandwich the semiconductor region 7 from the side surfaces.

Although there was illustrated a case in which the current electrodes, the N type semiconductor substrate and the Hall voltage detecting electrodes are isolated from the semiconductor substrate by a PN junction in the above-described embodiment, the present invention is not limited to this.

Figure 8:
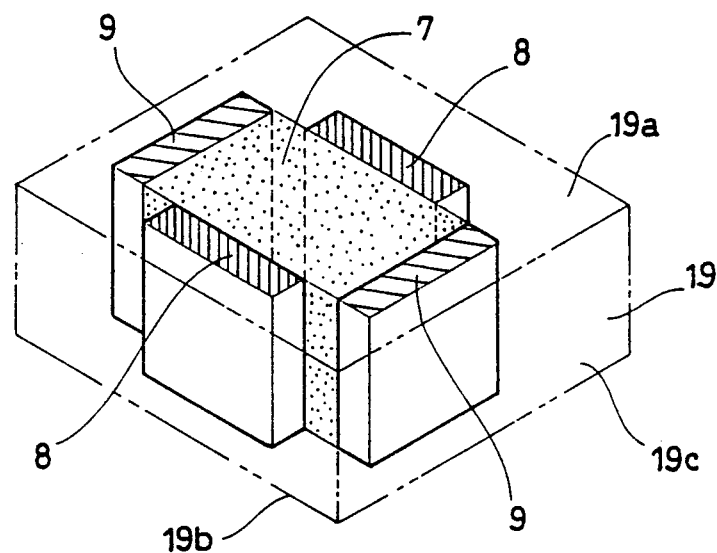
FIG. 8 is a perspective view of another embodiment of the Hall device in accordance with the present invention.

More specifically, it is possible to use as the above-described first Hall device the Hall device shown in FIG. 8, which comprises SiO$_2$ substrate 19 having a main surface 19a, a back surface 19b and a side surfaces 19c connected to the main and back surfaces 19a and 19b; a semiconductor region 7 provided in the SiO$_2$ substrate 19; a pair of current electrodes 9 and 9 provided in the SiO$_2$ substrate 19 so as to sandwich the semiconductor region 7 between the side surfaces; a pair of Hall voltage detecting electrodes 8 and 8 provided in the SiO$_2$ substrate 19 so as to sandwich the semiconductor region 7 in the direction vertical to arrangement direction of the pair of current electrodes 9 and 9. In this case, since the devices are isolated by SiO$_2$, a leak current is completely prevented from being generated.

Figure 9:
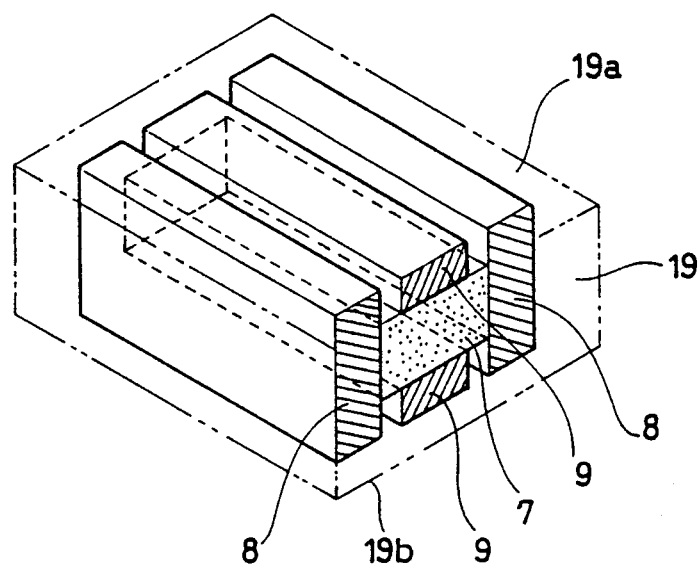
FIG. 9 is a perspective view of a further embodiment of the Hall device in accordance with the present invention.

In addition, it may be possible to use the Hall device in FIG. 9, as the second Hall device or the third Hall device. The Hall device comprises the SiO$_2$ substrate 19 having the main surface 19a, the back surface 19b and the side surfaces connected to the main and back surfaces; a semiconductor region 7 provided in the SiO$_2$ substrate; a pair of current electrodes 9 and 9 provided in the SiO$_2$ substrate so as to sandwich the semiconductor region 7 between the main and back surfaces 19a and 19b; and a pair of Hall voltage detecting electrodes 8 and 8 provided in the SiO$_2$ substrate so as to sandwich the semiconductor region 7 between the side surfaces. In this case, since the devices are isolated by SiO$_2$, the leak current is also completely prevented from being generated.

Figure 10:
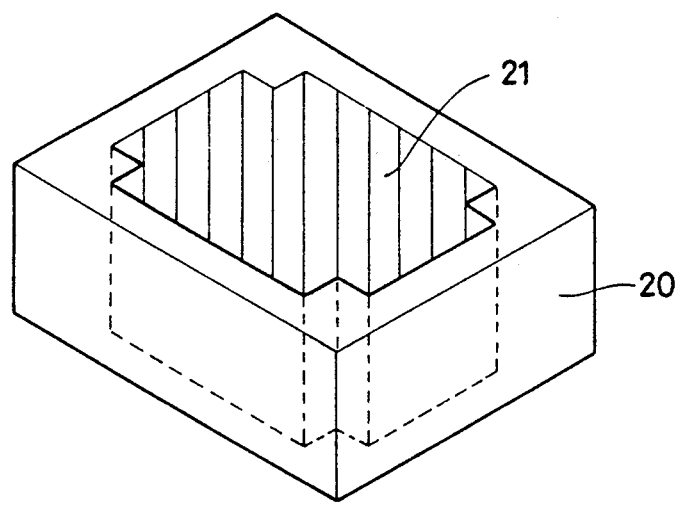
FIG. 10 is a view for describing a method of manufacturing the Hall device shown in FIG. 8.

FIG. 10 is a perspective view for describing a method of forming the Hall device as shown in FIG. 8. More specifically, referring to FIG. 10, a semiconductor substrate 20 is prepared to form a semiconductor layer 21 only on the portion where the Hall device is to be formed and the other portion is oxidized by the LOCOS method. Then, the Hall device shown in FIG. 8 is formed through the steps shown in FIG. 19A to 19F.

Figure 11:
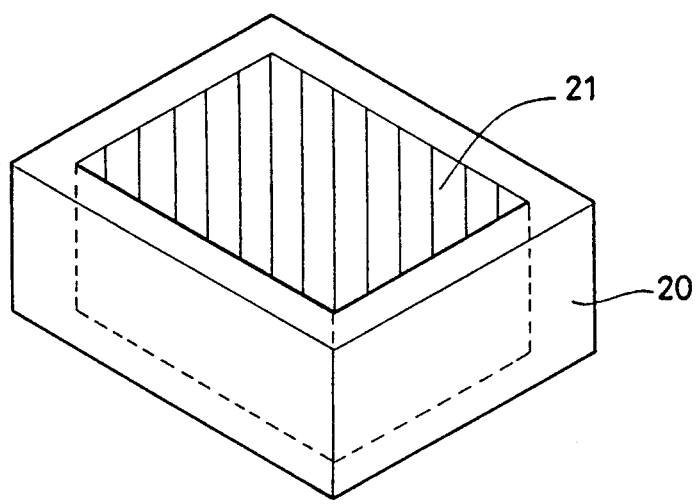
FIG. 11 is a view for describing a method of manufacturing the Hall device shown in FIG. 10.

FIG. 11 is a perspective view for describing a method of forming the Hall device shown in FIG. 9. More specifically, referring to FIG. 11, a semiconductor substrate 20 is prepared to form a semiconductor layer 21 only on the portion where the Hall device is to be formed and the other portions are oxidized by the LOCOS method. Then, the Hall device shown in FIG. 9 is formed through the steps shown in FIGS. 6A to 6F.

Figure 12:
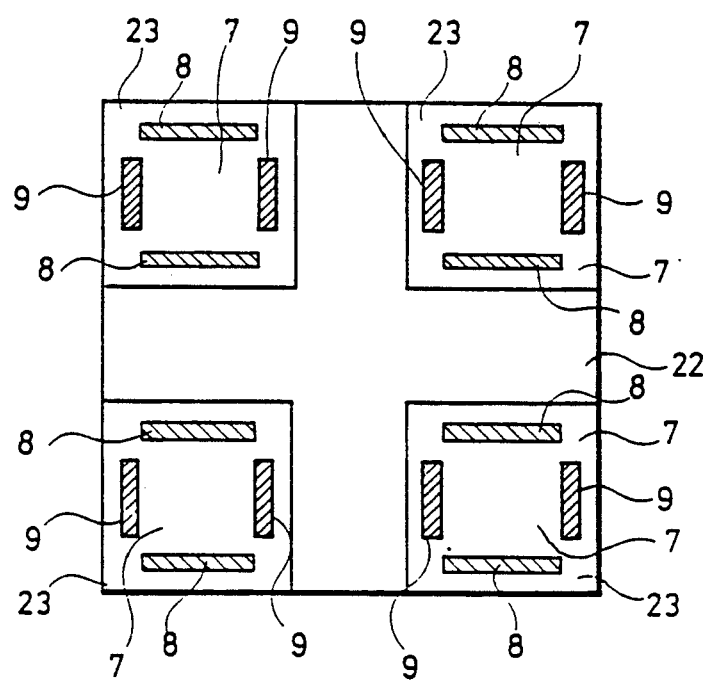
FIG. 12 is a perspective view of still another embodiment of the Hall device in accordance with the present invention.
Figure 13:
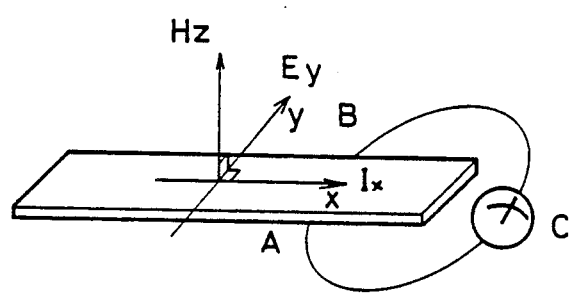
FIG. 13 is a view for describing the Hall effect.
Figure 14:
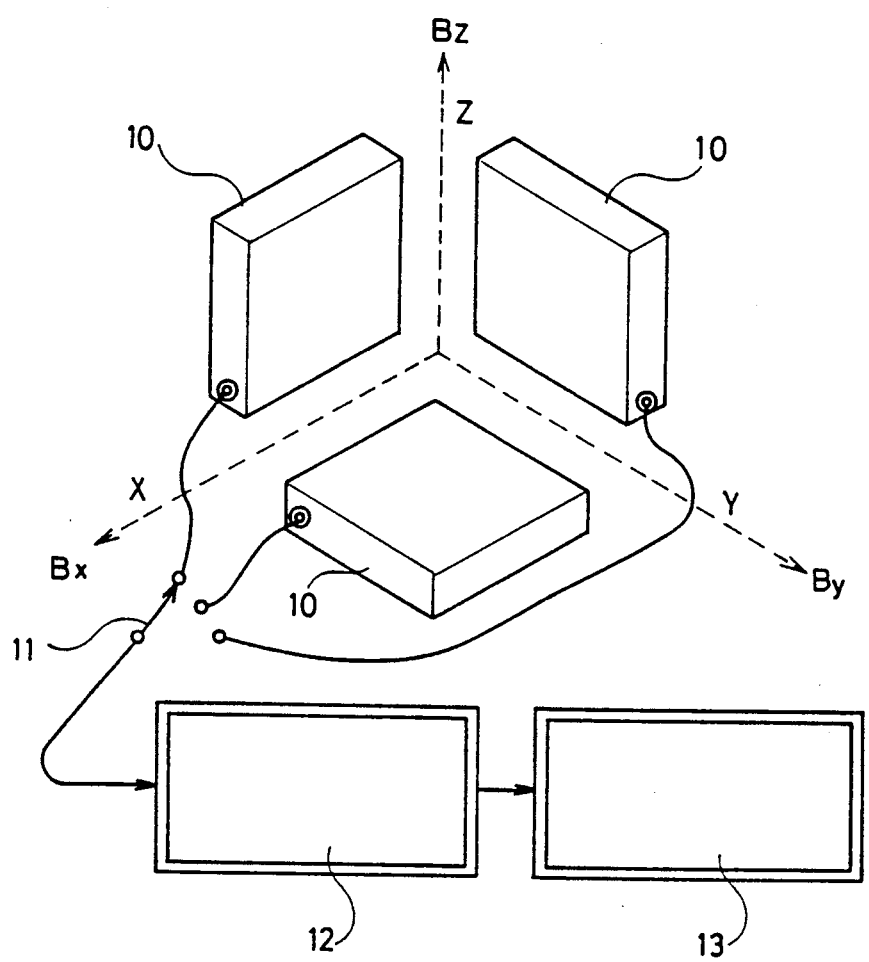
FIG. 14 is a conceptual diagram of a conventional magnetic sensor system.

FIG. 12 is a plan view of another embodiment of the Hall device used in the magnetic sensor system in accordance with the present invention. Referring to FIG. 12, a plurality of P type regions 23 are formed in an N type semiconductor substrate 22. An N type semiconductor region 7 is formed in its P type region 23. In addition, a pair of current electrodes 9 and 9 are provided so as to sandwich the N type semiconductor region 7 between the side surfaces in its P type region 23. Also, a pair of Hall voltage detecting electrodes 8 and 8 is provided so as to sandwich the N type semiconductor region 7 in the direction vertical to arrangement direction of the pair of current electrodes 9 and 9 in its P type region 23. It becomes possible to detect also the change of a magnetic flux component in the chip when the substrate comprising a plurality of Hall devices which detects a magnetic flux component in the direction vertical to the substrate is used in the magnetic sensor system shown in FIG. 1, as shown in FIG. 12. Alternatively, a plurality of Hall devices may be formed in a SiO$_2$ substrate.

Although there was illustrated the magnetic sensor system comprising the first substrate 1 which detects the magnetic flux component B$_Z$ in the direction of the Z-axis; the second substrate which detects the magnetic flux component B$_Y$ in the direction of the Y-axis, and the third substrate which detects the magnetic flux component B$_X$ in the direction of the X-axis as shown in FIG. 1 in the above-described embodiment, the present invention is not limited to this structure and the third substrate may be dispensed with in case of a magnetic sensor system which has only to detect the magnetic flux components in the directions of the Z-axis and Y-axis.

As described above, according to the Hall device in accordance with the present invention, since the same comprises a substrate having a main surface, a back surface and a side surfaces connected to the main and back surfaces; a semiconductor region provided in the substrate; a pair of current electrode provided in the substrate so as to sandwich the semiconductor region between the main and back surfaces; and a pair of Hall voltage detecting electrodes provided in the substrate so as to sandwich the semiconductor region between the side surfaces, it is possible to detect a magnetic flux component in the direction parallel to the substrate when the substrate is placed on the horizontal surface. Therefore, it becomes possible to constitute the magnetic sensor system by putting the Hall device on the conventional Hall device and, as a result, the size of the magnetic sensor system can be miniaturized.

According to the magnetic sensor system of the present invention, it comprises a first substrate and a second substrate provided on the first substrate, the first substrate comprising a first Hall element which detects a magnetic flux component in the vertical direction to the first substrate and the second substrate comprising a second Hall device which detects a magnetic flux component in the direction vertical to the magnetic field direction of the magnetic flux component detected by the first Hall device. Since the second substrates put on the first substrate in this way, the distance between the Hall devices is shortened and, as a result, the power consumption is reduced as compared with that of the conventional magnetic sensor system.

In addition, if a third subs&:rate is also put on the second substrate and the third substrate comprises a third Hall device which detects a magnetic flux component in the direction vertical to the magnetic field directions of the magnetic flux components detected by the first and second Hall devices, it becomes possible to detect the magnetic flux components of three directions. In this case, the distance between the Hall devices is also shortened as compared with the conventional magnetic sensor system, whereby the power consumption is reduced.

In addition, when a fourth substrate is put on the substrate and the A/D converter and a digital signal processing circuit electrically connected to A/D converter are formed on this fourth substrate and the output terminals of the first, second and third fourth devices are connected electrically to the A/D converter, the size, direction and the like of the magnetic components can be calculated. In this case, the distance between devices is also shortened as compared with the conventional magnetic sensor system, whereby the power consumption is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A Hall device comprising:
   a semiconductor substrate having a main surface, a back surface opposite said main surface and a pair of opposing side surfaces connected to said main and back surfaces, said Hall device comprising:
   a semiconductor region embedded in said substrate, said semiconductor region having opposite main and back surfaces and a pair of side surfaces parallel to and spaced apart from respective ones of said main, back and side surfaces of said substrate;
   a pair of current electrodes constituted by first highly doped regions embedded in said substrate respectively between said main surfaces of said substrate and said semiconductor region and between said back surfaces of said substrate and semiconductor region so as to sandwich said semiconductor region between said main and back surfaces of said substrate; and
   a pair of Hall voltage detecting electrodes constituted by second highly doped regions embedded in said substrate respectively between side surfaces of said substrate and semiconductor region.

2. A Hall device in accordance with the claim 1, wherein
   said substrate comprises a semiconductor substrate of a certain conductivity type and said semiconductor region comprises a semiconductor region of a conductivity type opposite to that of the semiconductor substrate.

3. A Hall device in accordance with claim 1, wherein said substrate comprises $SiO_2$ substrate.

4. A Hall device comprising:
   a $SiO_2$ substrate having a main surface, a back surface opposite said main surface and first and second pairs of opposing side surfaces connected to said main and back surfaces;
   a semiconductor region embedded in said $SiO_2$ substrate having first and second pairs of opposing side surfaces parallel to and spaced apart from respective ones of said first and second pairs of side surfaces of said substrate;
   a pair of current electrodes constituted by first highly doped regions embedded in said $SiO_2$ substrate respectively between respective first pairs of side surfaces of said substrate and semiconductor region; and
   a pair of Hall voltage detecting electrodes constituted by second highly doped regions embedded in said $SiO_2$ substrate on respective opposing surfaces of said semiconductor region other than on which said current electrodes are provided.

5. A Hall device comprising:
   a first conductivity type semiconductor substrate having a main surface, a back surface opposite said main surface and a pair of opposing side surfaces connected to said main and back surfaces;
   a semiconductor region provided in said substrate, said semiconductor region having opposite main and back surfaces and a pair of side surfaces parallel to and spaced apart from respective ones of said main, back and side surfaces of said substrate;
   a pair of current electrodes constituted by first highly doped regions embedded in said substrate respectively between said main surfaces of said substrate and said semiconductor region and between said back surface of said substrate and semiconductor region; and
   a pair of Hall voltage detecting electrodes constituted by second highly doped regions embedded in said substrate respectively between side surfaces of said substrate and semiconductor region.

6. A Hall device in accordance with claim 1, wherein the length of each said Hall voltage detecting electrodes is equal to the length of said semiconductor region in a direction from said main to said back surface of said semiconductor region.

7. A Hall device in accordance with claim 1, wherein each said Hall voltage detecting electrodes completely covers side surfaces of said semiconductor region.

* * * * *